(12) United States Patent
Han et al.

(10) Patent No.: US 7,407,872 B2
(45) Date of Patent: Aug. 5, 2008

(54) EPITAXIAL GROWTH OF ALIGNED ALGALNN NANOWIRES BY METAL-ORGANIC CHEMICAL VAPOR DEPOSITION

(75) Inventors: Jung Han, Woodbridge, CT (US); Jie Su, New Haven, CT (US)

(73) Assignee: Yale University, New Haven, CT (US)

( * ) Notice: Subject to any disclaimer, the term of this patent is extended or adjusted under 35 U.S.C. 154(b) by 91 days.

(21) Appl. No.: 11/207,226

(22) Filed: Aug. 19, 2005

(65) Prior Publication Data
US 2006/0073680 A1   Apr. 6, 2006

Related U.S. Application Data

(60) Provisional application No. 60/603,227, filed on Aug. 20, 2004.

(51) Int. Cl.
H01L 21/205 (2006.01)
(52) U.S. Cl. .................. 438/483; 438/503; 977/763
(58) Field of Classification Search .......... 977/762, 977/763, 782, 916, 890
See application file for complete search history.

(56) References Cited

U.S. PATENT DOCUMENTS

| | | | |
|---|---|---|---|
| 6,602,763 B2 | 8/2003 | Davis et al. | |
| 6,770,914 B2 | 8/2004 | Shibata et al. | |
| 6,831,017 B1 * | 12/2004 | Li et al. | 438/694 |
| 2003/0008505 A1 | 1/2003 | Chen et al. | |
| 2003/0067003 A1 * | 4/2003 | Gole et al. | 257/64 |
| 2004/0127012 A1 * | 7/2004 | Jin | 438/618 |
| 2004/0144970 A1 * | 7/2004 | Wang et al. | 257/17 |
| 2005/0133476 A1 * | 6/2005 | Islam et al. | 216/2 |
| 2006/0019470 A1 * | 1/2006 | Seifert et al. | 438/483 |

FOREIGN PATENT DOCUMENTS

WO  WO 2005110057 A2 * 11/2005

OTHER PUBLICATIONS

Role of Surface Diffusion In Chemical Beam Epitaxy Of InAs Nanowires, Jensen et al., Nano Letters, vol. 4, No. 10, pp. 1961-1964, Sep. 2004.
Crystallographic Alignment of High-Density Gallium Nitride Nanowire Arrays, Kuykendall et al., Nature Materials, vol. 3, pp. 524-528, Aug. 2004.
Single-Crystal Metallic Nanowires and Metal/Semiconductor Nanowire Heterostructures, Wu et al., Nature, vol. 430, pp. 61-65, Jul. 2004.
Large-Scale Hierarchical Organization of Nanowire Arrays for Integrated Nanosystems, Whang et al., Nano Letters, vol. 3, No. 9, 1255-1259, Aug. 2003.

(Continued)

*Primary Examiner*—Stephen W Smoot
(74) *Attorney, Agent, or Firm*—Carmody & Torrance LLP (57) ABSTRACT

Highly ordered and aligned epitaxy of III-Nitride nanowires is demonstrated in this work. <10$\bar{1}$0> M-axis is identified as a preferential nanowire growth direction through a detailed study of GaN/AlN trunk/branch nanostructures by transmission electron microscopy. Crystallographic selectivity can be used to achieve spatial and orientational control of nanowire growth. Vertically aligned (Al)GaN nanowires are prepared on M-plane AlN substrates. Horizontally ordered nanowires, extending from the M-plane sidewalls of GaN hexagonal mesas or islands demonstrate new opportunities for self-aligned nanowire devices, interconnects, and networks.

25 Claims, 7 Drawing Sheets

OTHER PUBLICATIONS

Synthesis of p-Type Gallium Nitride Nanowires For Electronic and Photonic Nanodevices, Zhong et al., Nano Letters, vol. 3, No. 3, pp. 343-346, Feb. 2003.

Growth and Characterization of GaN Nanowires On Si Substrate Using Ni Catalyst In A Chemical Vapor Deposition Reactor, Lee et al., Phys. stat. sol. (c) 0, No. 1, pp. 148-151, 2002.

Controlled Growth of Gallium Nitride Single-Crystal Nanowires Using a Chemical Vapor Deposition Method, Han et al., J. Mater. Res. vol. 18, No. 2, Feb. 2003.

General Synthesis of Compound Semiconductor Nanowires, Duan et al., Advanced Materials, vol. 12, No. 4, pp. 298-302, 2000.

Polarization Effects in Photoluminescence of C- and M-plane GaN/AlGaN Multiple Quantum Wells, Kuokstis et al., Applied Physics Letters, vol. 81, No. 22, Nov. 2002.

Catalytic Synthesis and Photoluminescence of Gallium Nitride Nanowires, Lyu et al. Chemical Physics Letters, vol. 367, pp. 136-140, 2003.

Catalytic Growth and Characterization of Gallium Nitride Nanowires, Chen et al., Journal of the American Chemical Society, vol. 123, pp. 2791-2798, 2001.

Directed Assembly of One-Dimensional Nanostructures Into Functional Networks, Huang et al., Science, vol. 291, pp. 630-633, Jan. 2001.

Mass Transport In The Epitaxial Lateral Overgrowth of Gallium Nitride, Mitchell et al., Journal of Crystal Growth, vol. 222, pp. 144-153, 2001.

Electric-field Assisted Assembly And Alignment of Metallic Nanowires, Smith et al., Applied Physics Letters, vol. 77, No. 9, pp. 1399-1401, August 2000.

Preparation of II-VI Group Semiconductor Nanowire Arrays By DC Electrochemical Deposition In Porous Aluminum Oxide Templates, Xu et al., Pure Appl. Chem., vol. 72, Nos. 1-2, pp. 127-135, 2000.

Theory of GaN(1010) and (1120) Surfaces, Northrup et al., Physical Review B, vol. 53, No. 16, Apr. 1996, pp. R10477-R10480.

A Laser Ablation Method For The Synthesis Of Crystalline Semiconductor Nanowires, Morales et al., Science, vol. 279, Jan. 1998.

Photolithographic Route To the Fabrication of Micro/Nanowires of III-V Semiconductors, Sun et al., Adv. Funct. Mater, vol. 15, No. 1, pp. 30-40, Jan. 2005.

Catalytic Growth Of Group III-Nitride Nanowires and Nanostructures By Metalorganic Chemcial Vapor Deposition, Cui et al., Applied Physics Letters, Vol. 86, 2005.

Spatial Control of InGaN Luminescence by MOCVD Selective Epitaxy, Kapolnek et al., Journal of Crystal Growth, vol. 189/190, pp. 83-86, 1998.

Mechanisms Of Lateral Epitaxial Overgrowth Of Gallium Nitride by Metalorganic Chemical Vapor Deposition, Journal of Crystal Growth, vol. 195, pp. 328-332, 1998.

Recent Progress In Selective Area Growth and Epitaxial Lateral Overgrowth of III-Nitrides: Effects of Reactor Pressure in MOVPE Growth, Hiramatsu et al., Phys. stat. sol. (a) vol. 176, pp. 535-543, 1999.

Laser-Assisted Catalytic Growth of Single Crystal GaN Nanowires, Duan et al., Journal of the American Chemical Society, vol. 122, pp. 188-189, 2000.

Growth of M-Plane GaN(1100): A Way to Evade Electrical Polarization in Nitrides, Waltereit et al., Phys. stat. sol. (a) vol. 180, pp. 133-138, 2000.

* cited by examiner (a) Sapphire substrate (b) One-step GaN growth (c) E-beam evaporation of Ni (d) MOCVD nanowire growth

EPITAXIAL GROWTH OF ALIGNED ALGALNN NANOWIRES BY METAL-ORGANIC CHEMICAL VAPOR DEPOSITION

CROSS-REFERENCE TO RELATED APPLICATIONS

This application claims the benefit of priority to U.S. Provisional Patent Application No. 60/603,227, filed on Aug. 20, 2004, the subject matter of which is herein incorporated by reference in its entirety.

STATEMENT REGARDING FEDERALLY SPONSORED RESEARCH OR DEVELOPMENT

This invention was partially made with U.S. Government support from the Department of Energy Contract No. DE-FC26-03NT41941 and National Science Foundation Research Award No. ECS-0304468. Accordingly, the U.S. Government may have certain rights in this invention.

FIELD OF THE INVENTION

This invention relates to the epitaxial growth of aligned AlGaInN nanowires by metal-organic chemical vapor deposition (MOCVD) and an improved method for accomplishing the same.

BACKGROUND OF THE INVENTION

Nanowires are wire-like structures on the order of about 1 to 100 nm in diameter with a length of about 1 to 30 μm. Nanowires offer unique opportunities in studying electronic transport in low-dimension structures. A very high surface-to-volume ratio also makes nanowires attractive as adsorption-based chemical and biological sensors.

Single-crystalline one-dimensional semiconductor nanostructures are considered to be one of the critical building blocks for nanoscale optoelectronics. Control over the nanowire growth direction is extremely desirable, especially because anisotropic parameters such as thermal and electrical conductivity, index of refraction, piezoelectric polarization and band gap may be used to tune the physical properties of nanowires made from a given material.

Gallium nitride is a wide-bandgap semiconductor and a prime candidate for use in high-performance, high power optoelectronic devices because of its high melting point, carrier mobility, and electrical breakdown field. Single-crystalline gallium nitride planar structures and nanowires have shown promise for use in photonic and biological nanodevices such as blue light-emitting diodes, short-wavelength ultraviolet nanolasers, and nanofluidic biochemical sensors.

Furthermore, bottom-up fabrication of semiconductor nanostructure is of considerable interest for exploring quantum phenomena and future-generation devices. Employment of vapor-liquid-solid (VLS) mechanism of growth renders a unique pathway to one dimensional (1D) semiconductor nanowires that are promising components in nanoscale technology. Based on the VLS principle wide bandgap GaN nanowires have been prepared using techniques such as pulsed laser deposition, near-equilibrium tube-furnace deposition, and, most recently, conventional metalorganic chemical vapor deposition (MOCVD).

In VLS growth, a liquid metal cluster or catalyst acts as the energetically favored site for the absorption of gas-phase reactants. The cluster supersaturates and grows a 1D structure of the material. The VLS mechanism can be divided into three main stages: 1) nucleation, 2) precipitation, and 3) deposition. Prerequisites to VLS growth that have been identified include: (1) a sizable disparity in reaction kinetics between regular vapor-solid (VS) and the VLS mechanisms, thus mandating a lower supersaturation for growth selectivity; (2) the creation and retention of liquid droplets to facilitate adsorption and incorporation of vapor phase species; and (3) the need to have nucleation sites with appropriate crystallographic orientations conducive to the minimization of surface energies. Maintaining the VLS growth hinges on the identification and retaining of stoichiometry due to the strong tendency of GaN to solidify under a nitrogen-rich growth condition.

In contemporary synthesis of semiconductor nanowires, substrates have traditionally played a passive role in providing mechanical support and statistically averaged nucleation sites. A variety of substrates, including alumina, quartz, silicon dioxide, silicon (111), and C-axis sapphire have been explored. In almost all cases, morphology of haystack-like, random-oriented GaN nanowire is observed. In order to facilitate further processing and characterization, sonication of nanowires in organic solvents is performed to form a suspended solution. Nanowires are then transferred in solvent solution and become weakly attached (through van der Waals force) to the surface of target substrates during the evaporation of solvent. Elaborate techniques such as field-assisted alignment, micro-fluidic positioning, and the Langmuir-Blodget technique are then used to control the spatial distribution and ordering of the individual nanowires prior to contact lithography. Because of the challenges related to the current post-synthesis micro-scale manipulation of nanowires, it is highly desirable to provide an improved technique for more consistent and orderly growth of nanowires that is capable of overcoming some of the difficulties of the prior art.

SUMMARY OF THE INVENTION

It is an object of the present invention to provide a method in which group III-V nanowires, such as GaN nanowires, can be grown in an orderly fashion in a selected growth direction.

It is another object of the present invention to describe and demonstrate a new paradigm of making a new type of horizontally interconnected nanowire device through epitaxial growth.

To that end, the present invention is directed to an improved method of growing nanowires in a selected growth direction, comprising the steps of:

providing a substrate on which islands or mesas are capable of being formed;

forming islands or mesas on a surface of the substrate;

activating exposed surfaces of the islands or mesas to prepare the islands or mesas for the growth of nanowires thereon; and growing at least one nanowire in a selected growth direction from the activated surfaces of the islands or mesas.

DETAILED DESCRIPTION OF THE PREFERRED EMBODIMENTS

The spontaneous formation and parallel organization of semiconductor nanostructures through epitaxy (the growth of a crystal on a crystalline substrate that determines the layers' orientation) has advanced tremendously in the past decade and emerged as a complimentary technique to the self-assembly of nanowires. The inventors of the present invention have developed an improved technique for the control of ordering and directionality of (Al, Ga)N nanowires by resorting to epitaxial seeding based on crystallographic constraints and selective catalyst application. The inventors have identified that the M-axis [10$\underline{1}$0] is the preferred growth direction for (Al, Ga)N nanowires under the described growth conditions. Using both M-plane AlN substrates and C-plane GaN epilayers with designed side-wall facets, the inventors have demonstrated selective growth of both vertically- and horizontally-aligned nanowires.

The present invention completely bypasses the need for solvent sonication and enables a directional construction of both horizontal and vertical growths over pre-patterned gallium nitride mesas or islands. The mesas or patterns can then be employed as a convenient base for macroscopic contacts and interfaces to the nanodevices.

The present invention is directed to an improved method of growing nanowires in a selected growth direction, comprising the steps of:

providing a substrate on which islands or mesas are capable of being formed;

forming islands or mesas on a surface of the substrate;

activating exposed surfaces of the islands or mesas to prepare the islands or mesas for the growth of nanowires thereon; and growing at least one nanowire in a selected growth direction from the activated surfaces of the islands or mesas.

Figure 1:
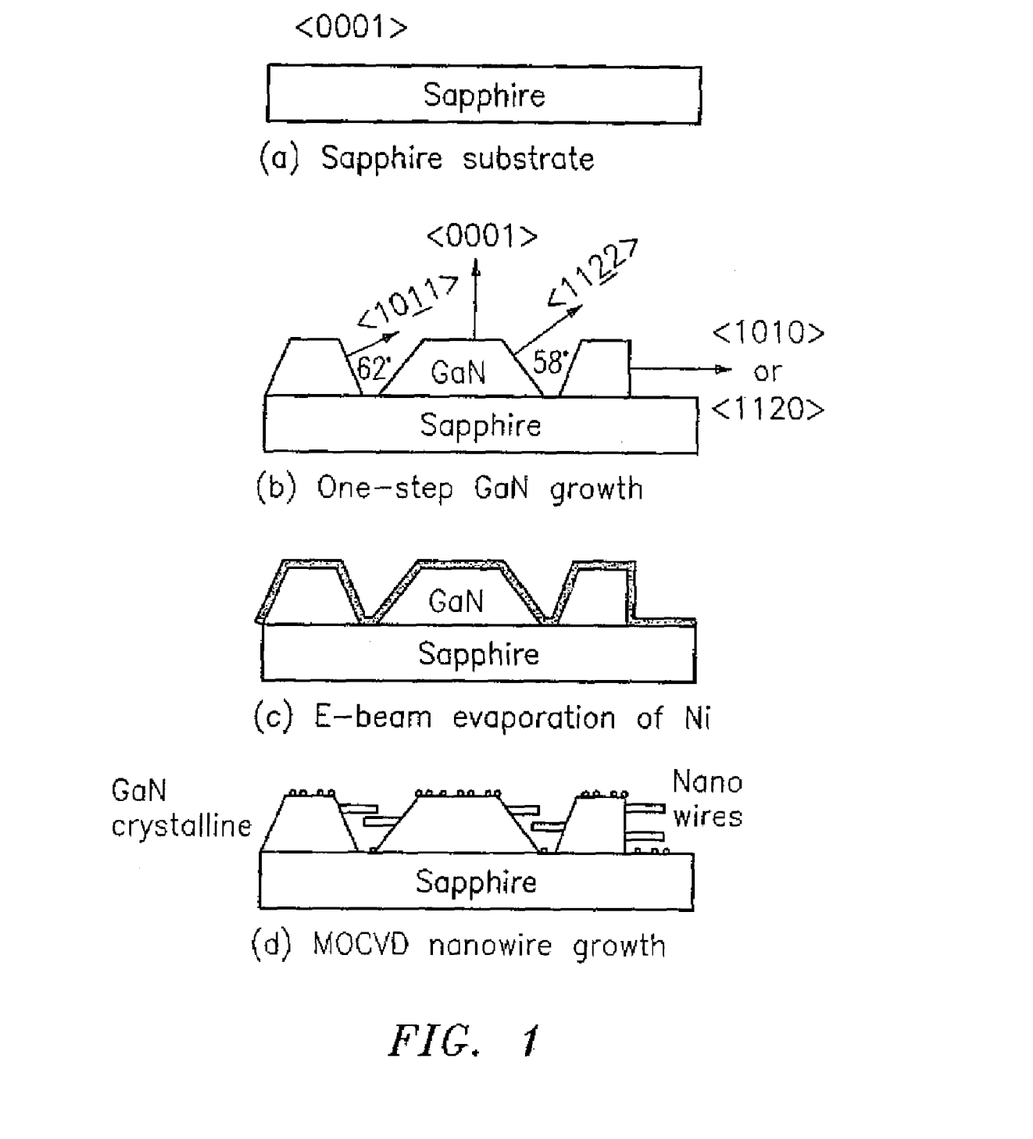
FIG. 1 depicts the typical steps in growing nanowires in a preferred growth direction in accordance with the present invention.

The various elements of this process are set forth in FIG. 1, in which a sapphire substrate is used to demonstrate the process of the invention. The substrate of the invention is preferably selected from the group consisting of sapphire, silicon carbide, aluminum nitride, and silicon. In one preferred embodiment, the substrate is sapphire. In another preferred embodiment, the substrate is silicon.

As demonstrated in FIG. 1, GaN islands or mesas are formed on the surface of the sapphire substrate. As seen in the figures, the GaN islands or mesas have pyramidal sidewall, with surfaces that incline about 30° from surface normal. Furthermore, as seen in FIG. 1, growth planes of the GaN islands or mesas are provided as a reference (e.g., <10$\underline{1}$0> and <11$\underline{2}$0>) to indicate the possible growth directions of the nanowires from the GaN islands or mesas.

Figure 2:
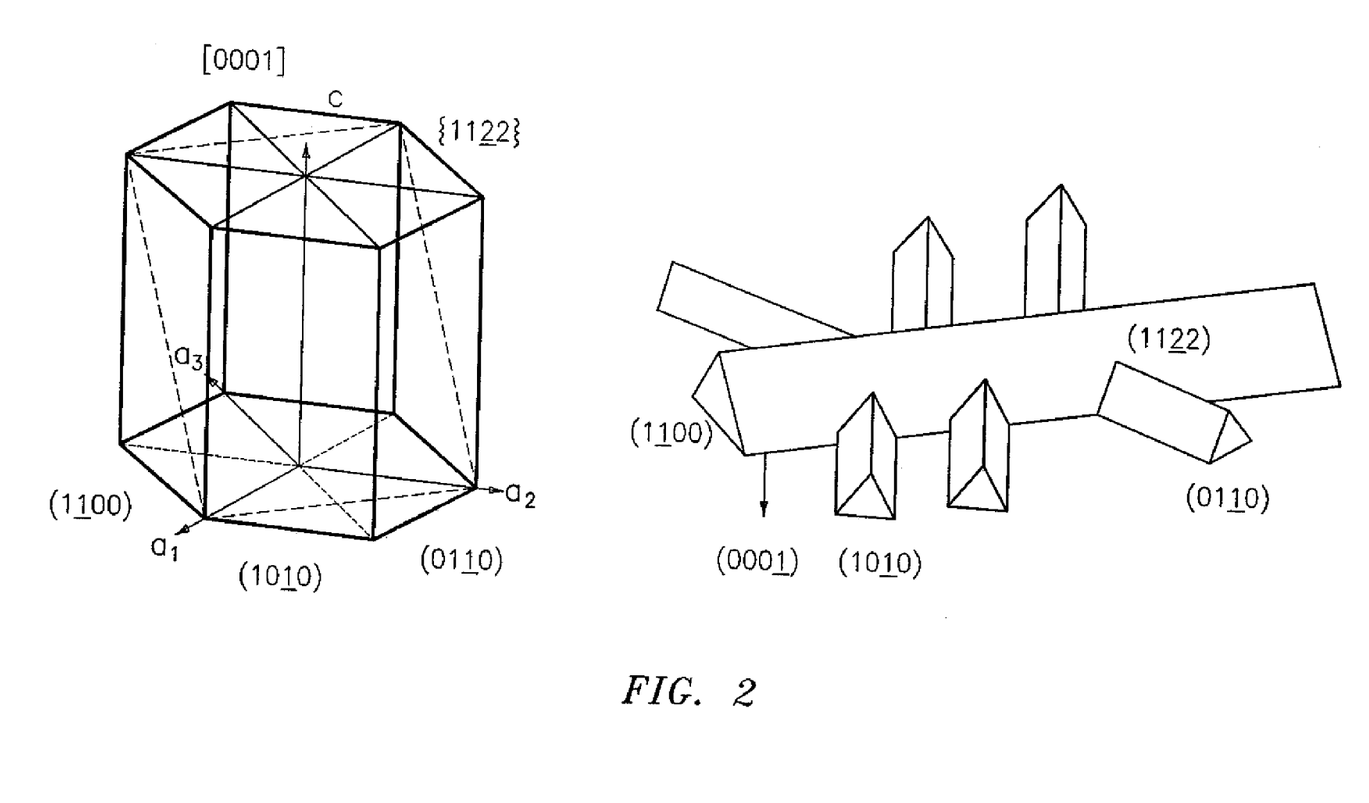
FIG. 2 depicts the six-fold symmetry of the gallium nitride and shows the preferred planes of the GaN mesas or islands on which the nanowires of the invention can be grown.

As seen in FIG. 2, crystalline gallium nitride exhibits 6-fold symmetry. The inventors of the present invention have surprisingly determined that certain planes of gallium nitride present preferred growth directions for nanowires to be grown thereon, and that other plane of the gallium nitride do not enable nanowires to be grown thereon; as will be discussed in further detail below.

The GaN islands or mesas are grown on the surface of the sapphire substrate by MOCVD. Prior to the growth of the GaN islands or mesas, the sapphire substrate is cleaned using a technique such as solvent degreasing. The synthesis of the GaN islands was carried out in a commercial horizontal MOCVD reactor (Aixtron AIX 200/4 RF-S MOCVD system). The reactor was maintained at a temperature of about 1000-1100° C. and a pressure of about 200 millibar (mbar) to atmosphere. A gallium precursor (trimethylgallium (TMGa)) and a nitrogen precursor ($NH_3$) were charged to the reactor. The flowrate of $NH_3$ was maintained at about 1-3 standard liters per minute (slm). Either nitrogen or a combination of nitrogen and hydrogen was used as a carrier gas.

The growth of the GaN islands or mesas was monitored by measuring the specular reflection of the sapphire substrate with a reflectometer. Once increased scattering was observed on the sapphire substrate at a certain level, indicating the growth of the islands or mesas, the growth process was stopped.

Next, the exposed surfaces of the gallium nitride islands or mesas are coated with a catalyst using electron beam metallization, to a depth of about 4 to 8 Å. A preferred catalyst is nickel, although gold and iron may also be used.

Finally the prepared substrate (with the mesas or islands formed and activated thereon) is placed back into the reactor under suitable conditions to facilitate the growth of nanowires in the preferred growth direction from the islands or mesas. Preferably, the growth conditions of the nanowires are set so as to grow the nanowires between adjacent islands or mesas in the preferred growth direction. The reactor is maintained at a temperature between about 700-1000° C. and a pressure of about 20 mbar to atmosphere for a period of time (about 30 minutes). The nanowires are observed to have a diameter between about 30-90 nanometers and a length of about 0.5 to 10 microns.

The reactor is charged with a gallium precursor, such as trimethylgallium (TMGa), a nitride precursor, such as ammonia, and optionally, an aluminum precursor, such as trimethylaluminum (TMAl) and/or an indium precursor such as trimethylindium (TMIn). Other precursor materials would also be known to one skilled in the art and would be usable in the practice of the invention. The use of TMGa and TMAl enables a flexible synthesis of (Al, Ga)N nanowires, including GaN, AlGaN and InGaN nanowires. The relative ratio of gallium to aluminum is in the range of about 100%-20% gallium to about 0% to 80% aluminum. Gallium and aluminum make up about 50% of the semiconductor material, with the balance being nitride. Both nitrogen and hydrogen can be used as the carrier gas. The carrier gas contains a majority of nitrogen (typically greater than about 90% and up to 100%) and hydrogen (typically less than about 50%, more preferably less than about 10%).

In one example performed, the total flows of metalorganics and $NH_3$ were set at 34 µmol/min and 20 sccm, respectively, both nitrogen and hydrogen were used as carrier gases and pressure was maintained at 50 mbar.

TMIn may also be employed as an isoelectronic "solvent" agent to increase the sustainability of liquid droplets and alleviate the sensitive dependence on stoichiometry. The addition of indium to the process dramatically improves the yield and the morphology of the nanowires. It is believed that the lower melting point of indium stabilizes the formation of liquid droplets in the VLS growth mechanism. A high vapor pressure of indium ($10^{-3} \sim 10^{-2}$ Torr) at typical nanowire growth temperature (900° C.) implies that most of the indium undergoes steady-state adsorption and desorption processes with very little incorporation.

Scanning electron microscopy (SEM) was performed using a FEI XL30 ESEM. High-resolution transmission electron microscopy (TEM) was performed using a JEOL 2010 FasTEM. X-ray energy dispersive spectroscopy (EDS) was carried out in a Philips CM-12 TEM with a nominal beam diameter of 50 nm.

The inventors of the present invention have determined that nanowires do not tend to grow from the <0001> plane of the gallium nitride islands or mesas, but preferentially only grow from the <10$\bar{1}$0> and <11$\bar{2}$2> planes of the gallium nitride islands or mesas.

Another technique for growing nanowires is described in U.S. Patent Application Publication No. U.S. 2005/0133476 to Islam et al., the subject matter of which is herein incorporated by reference in its entirety. Islam describes a method of bridging lateral nanowires and a device using the same. Vertical Si(100) surfaces are formed in a horizontal surface of a silicon substrate, the first vertical surface is activated with a nanoparticle catalyst, and a semiconductor nanowire is grown laterally from the activated first surface in a direction towards a second vertical surface spaced apart from the first vertical surface. The (111) silicon lattice planes defined in Islam et al. are equivalent to the <0001> plane of the gallium nitride of the present invention.

Figure 3A:
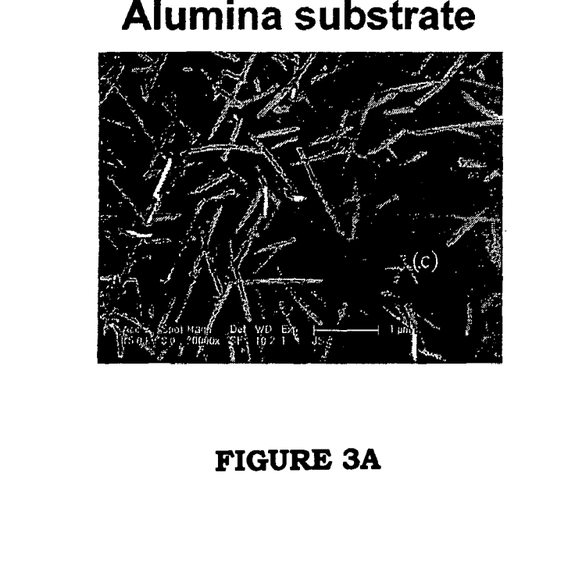
FIG. 3A depicts SEM images of GaN nanowires on alumina substrates and FIGS. 3B and 3C depict SEM images of GaN nanowires on M-plane AlN substrates.
Figure 3B:
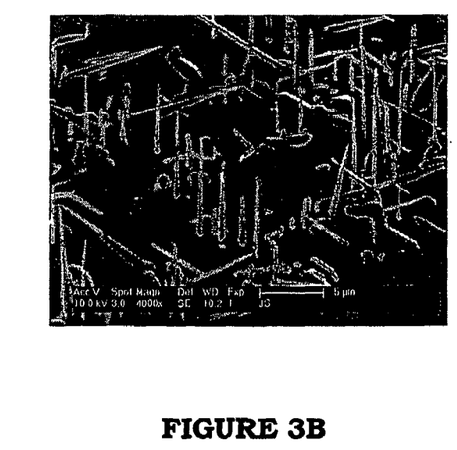
Figure 3C:
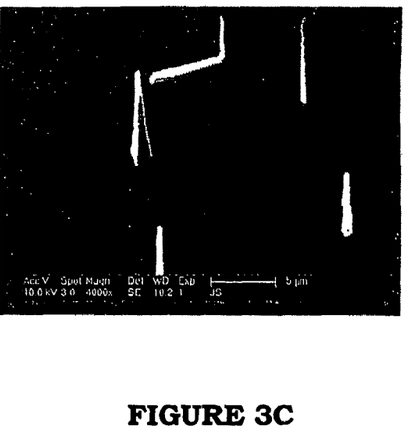

Crystallographic information forms the basis in designing and selecting an epitaxial system. It is identified from electron diffraction that MOCVD nanowires exhibit <10$\bar{1}$0> growth directions independent of the templates. Under the particular Ga-rich VLS growth mode, the <10$\bar{1}$0> planes emerge as the lowest-energy ones with the formation of Ga—Ga dimer reconstruction. Selected area electron diffraction and SEM further indicate that the MOCVD grown nanowires of the invention have a triangular cross-section, bound by <0001> and two <11$\bar{2}$2> planes as seen in FIGS. 3B and 3C.

Concerning the cross section of GaN nanowires, a useful analogy can be drawn from shape evolution during GaN epitaxial lateral overgrowth (ELO). <000$\bar{1}$>, <11$\bar{2}$0>, and <11$\bar{2}$2> have been identified as the surfaces that have low densities of dangling bonds (surface reconstruction is ignored) and in principle can be made free of atomic steps. The particular triangular cross section resembles triangular mesas when the ELO stripes are aligned along the <10$\bar{1}$0> directions. Growth of GaN epilayers along non-polar directions including M-axis is of interest due to the possibility of achieving heterostructures (e.g. nanowires comprising at least two different and distinguishable materials) that are free of built-in electric fields.

To test the idea of crystallographic alignment of nanowires epitaxially, GaN nanowires were grown on crystalline templates including C-plane GaN <0001> epilayers, M-plane AlN substrate (Crystal IS, Inc), and alumina substrates as a reference. Growth on alumina exhibited typical haystack morphology as seen in FIG. 3A owing to the random nature of the crystallographic orientation of the nucleation sites. Only crystallites were observed on C-plane GaN <0001> epilayer, in support of the assertion that VLS growth mode is closely related to crystallographic match and not crystalline perfection. Lastly, the growth on M-plane AlN substrates produces vertically aligned GaN nanowires having a triangular cross section (FIG. 3B). The triangular cross section is consistent with the designations from electron diffraction studies.

While the majority of nanowires grow vertically, the inventors also observed the growth of nanowires that are inclined 60° to surface normal along the equivalent <10$\bar{1}$0> M-axes. In regions with a reduced coverage of catalyst metal (e-beam evaporated nickel), the density of nanowires is reduced accordingly. In regions without nickel catalyst coating, only facetted crystallites of sub-micron size were found. Thus, it is seen that a combination of lithography and self-assembled patterning, produced vertical growth of ordered III-N nanowires on M-plane AlN or GaN substrates. This technique facilitates the practical implementation of nano-devices such as nanowire LEDs and field emitter displays.

Figure 4:
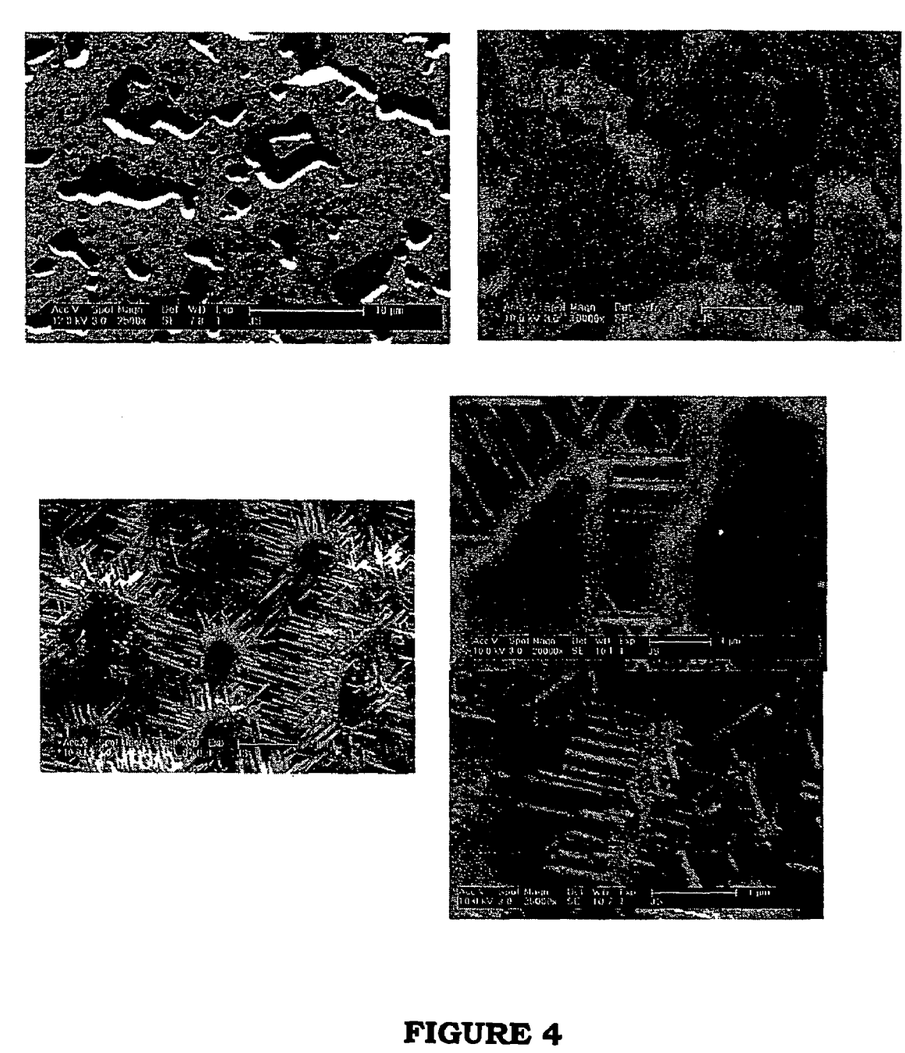
FIG. 4 depicts a plane-view SEM image of GaN nanowires on a "rough" GaN template on sapphire.
Figure 5:
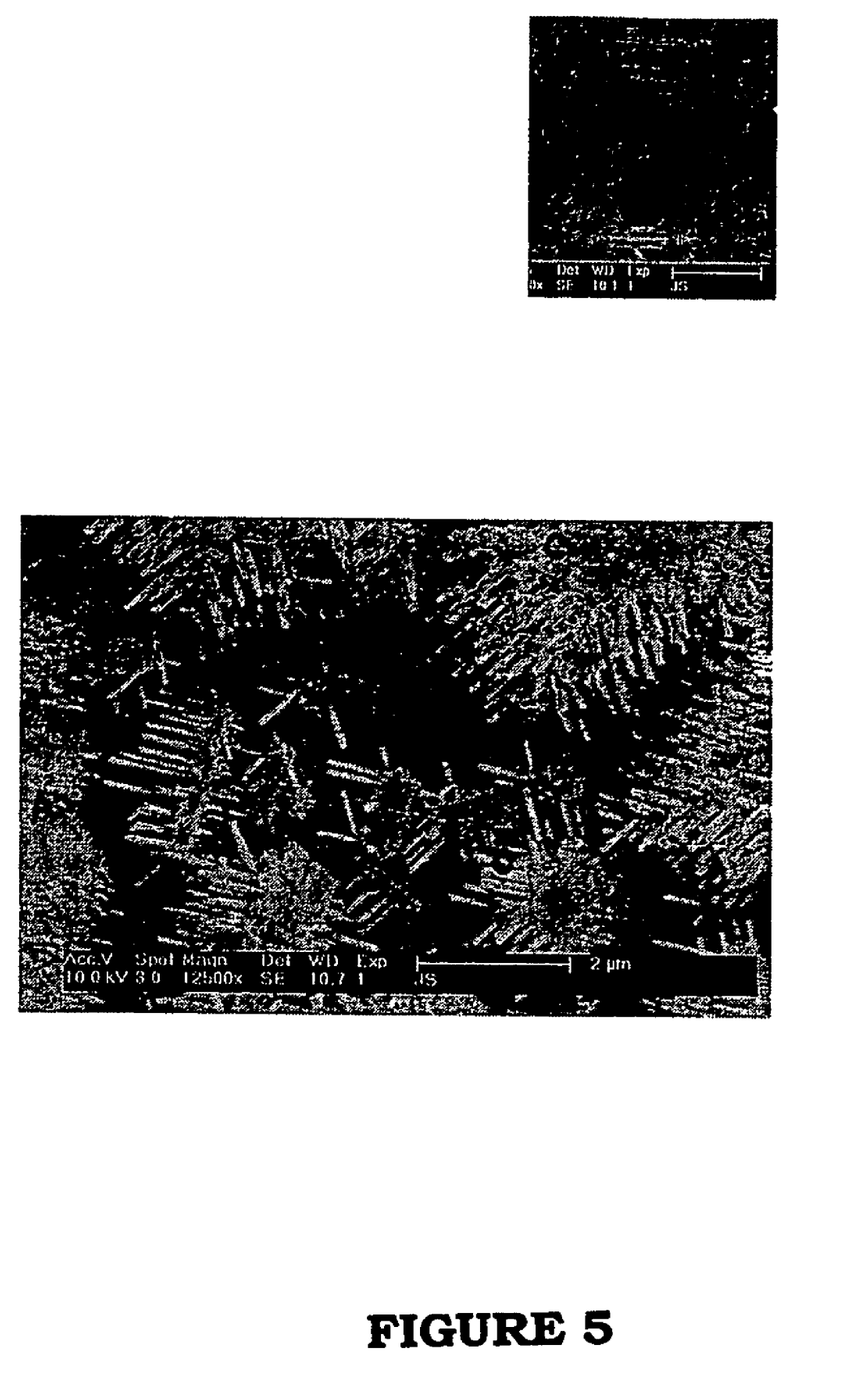
FIG. 5 depicts a different plane-view SEM image of GaN nanowires on GaN islands or mesas with the various planes of the GaN islands or mesas labeled.

In accordance with the present invention, the concept of selective epitaxial growth of GaN nanowires is also extended into templates with more complex topography. It was known that GaN nucleation on sapphire substrates, under either non-optimum conditions or before the complete coalescence, can at times exhibit a rough morphology with discrete C-axis oriented GaN mesas. These mesas typically possess a hexagonal symmetry with flat plateaus of <0001> basal plane (confirmed by x-ray diffraction) and pyramidal sidewalls. The inventors determined that an employment of facetted GaN mesas provides a combinatorial survey of the tendency and selectivity of nanowire growth along different planes. FIG. 4 shows plane-view SEM of GaN islands or mesas and AlGaN nanowires grown on such a "rough" GaN template. Horizontally-aligned nanowires emanating from the <10$\bar{1}$0> M-planes, forming directional arrays of nanowires of comparable diameters and lengths, can be clearly seen. As seen in FIG. 5, the <0001> C-plane, labeled C, is found not conducive to the nucleation of III-N nanowires, only crystallites were observed on top of the flat plateau.

As pyramidal <10$\bar{1}$n> M-planes assume more C-plane character with an increasing n, the efficacy of supporting nanowire growth diminishes (M' planes in FIG. 5). While the prism A-plane <11$\bar{2}$0> is not observed for the GaN mesas examined, the fact that pyramidal <11$\bar{2}$n> planes (labeled A') remain clean while neighboring pyramidal <10$\bar{1}$n> planes of a comparable degree of inclination exhibit a high density of nanowires implies a substantial and useful selectivity, due to disparity in atomic configuration and surface energy, between the M- and A-planes. The demonstration of horizontal M-axis nanowires presents a unique opportunity of integrating non-polar nanowire-based LEDs into C-plane GaN structures.

Figure 7:
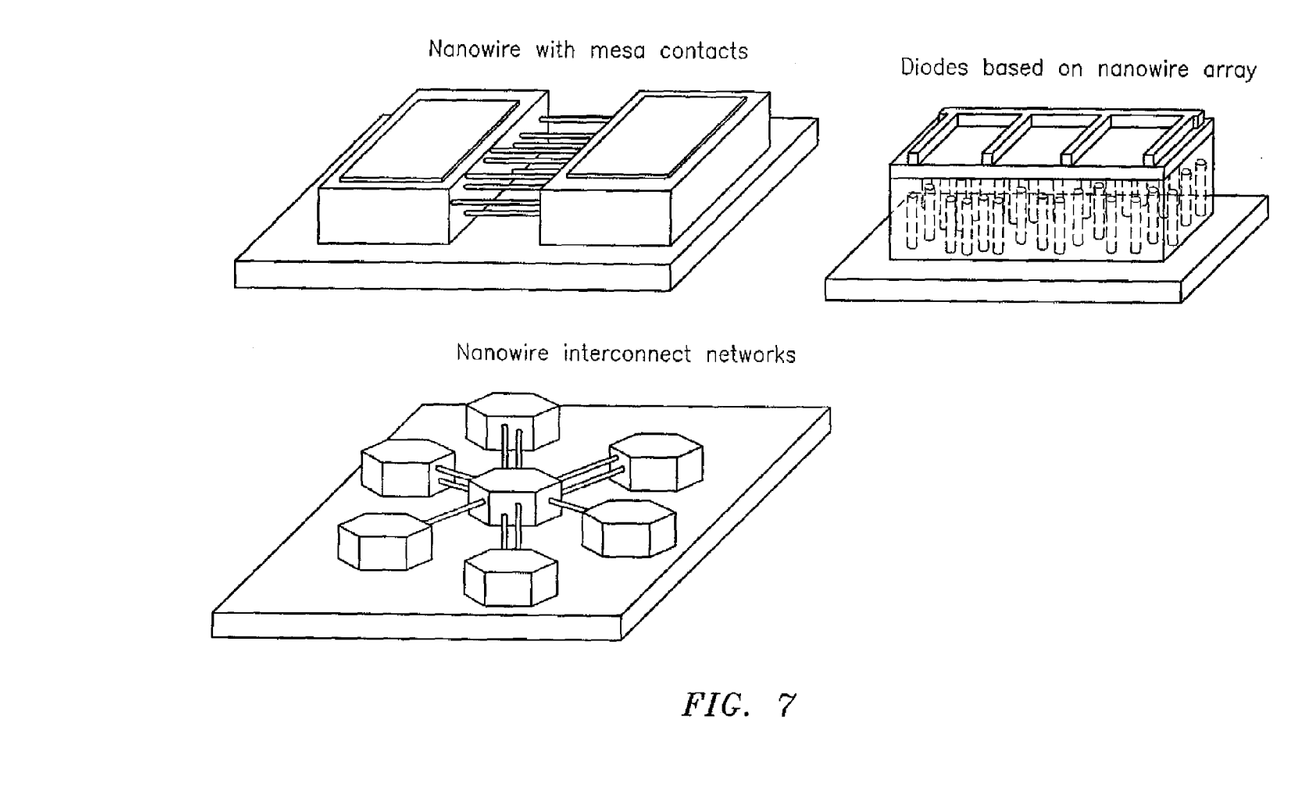
FIG. 7 depicts various examples of nanowire systems that may be possible using the process of the present invention.

FIG. 7 depicts various examples of nanowire systems that may be possible using the process of the present invention. FIG. 7 shows the plausibility of interconnecting two GaN mesas with an array of M-axis GaN nanowires, in which the number/density and location of the nanowires can be tailored conceivably by lithographical patterning of catalyst thin films.

Thus, in contrast to the current paradigm of post-synthesis dispersion and manipulation of nanowires, a new class of horizontal nanowire devices interconnected epitaxially between contact mesas, as well as complex nanowire networks, through a combination of lithography, epitaxial lateral overgrowth, and crystallographically aligned VLS growth is demonstrated.

Figure 6:
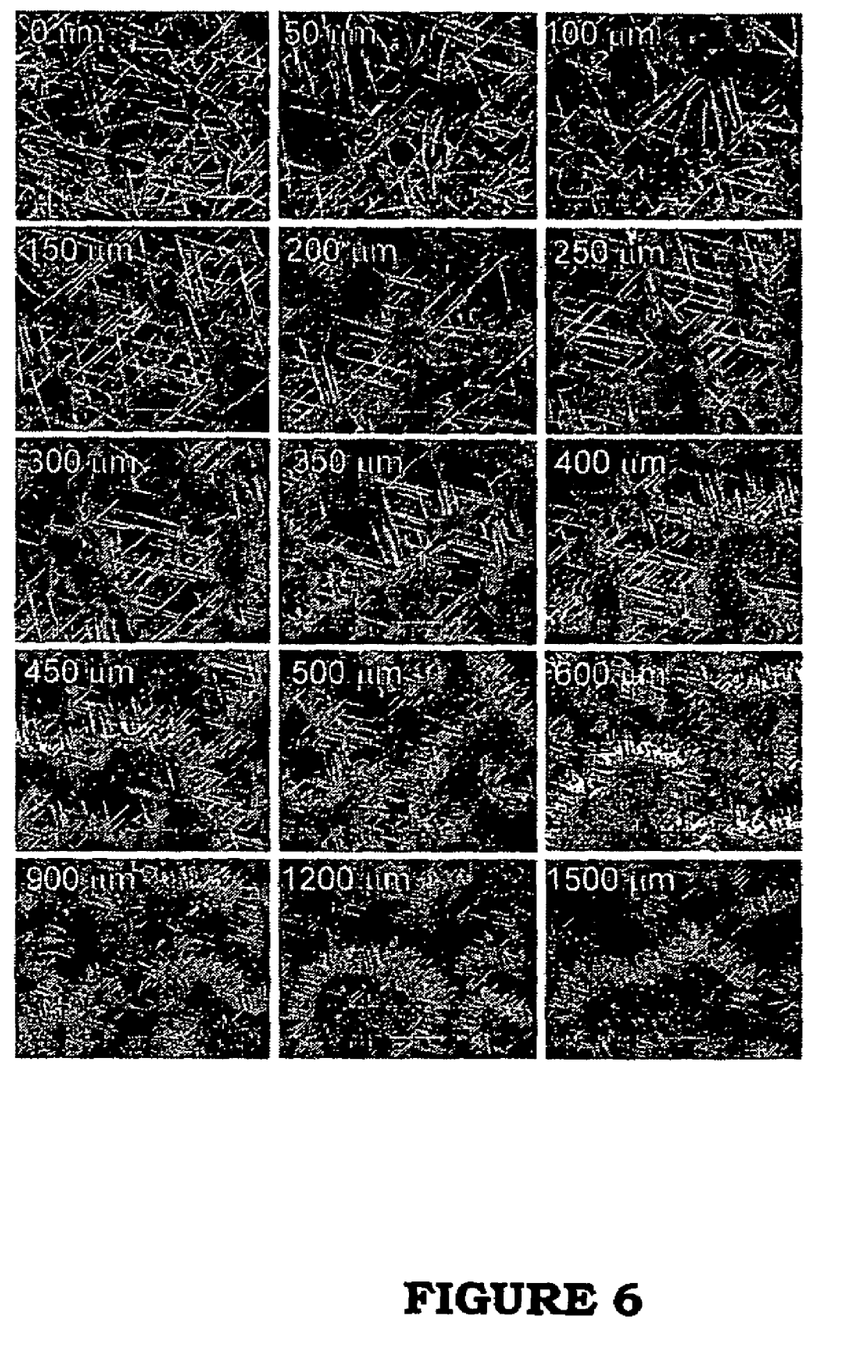
FIG. 6 depicts a series of SEM images to show the systematic variation of nanowire morphology at various locations on a sample grown in accordance with the present invention.

Typically MOCVD growth is carried out under diffusion-limited condition. This mechanism is manifested in a systematic variation of nanowire morphology from the edge of the sample toward center. GaN wafers were employed, and pieces of wafer were placed on a SiC-coated graphite susceptor having a diameter of 3 inches. A series of SEM images were taken progressively from sample edge ("0 µm" in FIG. 6) toward the center of wafer. Horizontal nanowires along the <10$\bar{1}$0> directions are observed in all cases, even though the length and density of nanowires exhibit monotonic variations, as summarized in FIG. 6. The profile of exponential-like decay in the length of nanowires over hundreds of micrometers resembles what was observed in the selective area growth of GaN from the edge of a half-plane dielectric mask and was attributed to lateral (parallel to surface) diffusion in the gas phase due to a step-like change in the concentration of metalorganic precursors across the wafer (or mask) edge. A higher concentration of TMGa near the wafer edge is responsible for longer nanowires. However, the observation of increasingly high density of wires toward the center and the appearance of nuclei on top of the GaN mesas cannot be adequately explained by the contraction gradient in gas phase alone.

The conventional VLS model for nanowire growth assumes the presence of liquid nanodroplets, which promotes the vapor phase incorporation of reactants and results in liquid-phase-epitaxy-like incorporation. An investigation into the microscopic growth mechanism for InAs nanowires showed that, under particular growth technique and conditions, surface diffusion plays a dominant role in transporting the reactants from wafer surface through the nanowires to the tips, contrary to the widely known model of VLS growth.

The nanowires grown in accordance with the process of the invention can be used in such applications as horizontal nanowire LEDs, conductance-based chemical and biological sensors, transistors, and cold-cathode, field emitter displays. Other applications would also be known to one skilled in the art and the invention is not limited to these examples.

While the invention has been particularly shown and described with respect to preferred embodiments thereof, it will be understood by those skilled in the art that changes in form and details may be made therein without departing from the scope and spirit of the invention.

What is claimed is:

1. A method of growing nanowires in a selected growth direction, comprising the steps of:
    providing a substrate on which semiconductor islands or mesas are capable of being formed;
    forming semiconductor islands or mesas on a surface of the substrate by growing the islands or mesas on the surface of the substrate using metalorganic chemical vapor deposition (MOCVD);
    activating exposed surfaces of the islands or mesas to prepare the islands or mesas for the growth of nanowires thereon; and
    growing at least one nanowire in a selected growth direction from the activated surfaces of the islands or mesas.

2. The method according to claim 1, wherein the substrate is selected from the group consisting of sapphire, silicon carbide, aluminum nitride, and silicon.

3. The method according to claim 2, wherein the substrate is sapphire.

4. The method according to claim 2, wherein the substrate is silicon.

5. The method according to claim 1, wherein the islands or mesas exhibit 6-fold symmetry and have planes that are capable of growing nanowires thereon, said planes comprising a <1010> plane and a <1122> plane.

6. The method according to claim 5, wherein the islands or mesas are selected from the group consisting of gallium nitride and aluminum gallium nitride.

7. The method according to claim 6, wherein the islands are gallium nitride.

8. The method according to claim 6 wherein the nanowires are grown in a reactor epitaxially ante activated surfaces of the mesas or islands using MOCVD.

9. The method according to claim 8, wherein the nanowires are grown on the <1010> and/or the <1122> planes of the gallium nitride mesas or islands.

10. The method according to claim 9, wherein the nanowires do not grow on a <0001> plane of the gallium nitride mesas or islands.

11. The method according to claim 8, wherein the reactor is charged with a gallium precursor, a nitrogen precursor, and optionally, an aluminum and/or an indium precursor.

12. The method according to claim 1, wherein MOCVD is performed in a horizontal reactor at a temperature of about 1000-1000° C. and a pressure of about 200 mbar to atmospheric pressure.

13. The method according to claim 12, wherein the reactor is charged with a gallium precursor and a nitrogen precursor.

14. The method according to claim 13, wherein the gallium precursor is trimethylgallium and the nitrogen precursor is ammonia.

15. The method according to claim 14, wherein the ammonia is charged to the reactor at a rate of about 1-3 standard liters per minute.

16. The method according to claim 1, wherein the exposed surfaces of the islands or mesas are activated by coating the exposed surfaces of the islands or mesas with a catalytic metal selected from the group consisting of nickel, gold, and iron.

17. The method according to claim 16, wherein the catalytic metal is applied by electron beam metallization.

18. The method according to claim 1, wherein the nanowires are grown in a reactor epitaxially using metalorganic chemical vapor deposition (MOCVD), and wherein the reactor is maintained at a temperature of about 700-1000° C. and a pressure of about 20 mbar to atmospheric pressure.

19. The method according to claim 18, wherein the reactor is maintained at a temperature of about 900° C.

20. The method according to claim 18, wherein the reactor is maintained at a pressure of about 50 mbar.

21. The method according to claim 18, wherein the nanowires are selected from the group consisting of gallium nitride, aluminum gallium nitride, and indium gallium nitride.

22. The method according to claim 18, wherein the reactor is charged with a gallium precursor, a nitrogen precursor, and optionally, an aluminum and/or an indium precursor.

23. The method according to claim 22, further comprising a carrier gas that is nitrogen or a combination of nitrogen and hydrogen.

24. A method of growing nanowires in a selected growth direction, comprising the steps of:
    providing a substrate on which semiconductor islands or mesas are capable of being formed;
    forming semiconductor islands or mesas on a surface of the substrate, wherein the islands or mesas are selected from the group consisting of gallium nitride and aluminum gallium nitride;
    activating exposed surfaces of the islands or mesas to prepare the islands or mesas for the growth of nanowires thereon; and
    growing at least one nanowire in a selected growth direction from the activated surfaces of the islands or mesas.

25. A method of growing nanowires in a selected growth direction, comprising the steps of:

provlding a substrate on which semiconductor islands or mesas are capable of being formed;

forming semiconductor islands or mesas on a surface of the substrate, wherein the islands or mesas are formed so that sidewalls of the islands or mesas are pyramidal;

activating exposed surfaces bf the islands or mesas to prepare the islands or mesas for the growth of nanowires thereon; and growing at least one nanowire in a selected growth direction from the activated surfaces of the islands or mesas.

\* \* \* \* \*

UNITED STATES PATENT AND TRADEMARK OFFICE
CERTIFICATE OF CORRECTION

PATENT NO.        : 7,407,872 B2                                      Page 1 of 1
APPLICATION NO.   : 11/207226
DATED             : August 5, 2008
INVENTOR(S)       : Jung Han et al.

It is certified that error appears in the above-identified patent and that said Letters Patent is hereby corrected as shown below:

On the title page, item [54]
Delete "ALGALNN" and replace it with --ALGAINN--

Column 7
Line 66, delete "ante" and replace it with --on the--

Column 8
Line 14, delete "1000-1000°C." and replace it with --1000-1100°C--

Signed and Sealed this

Seventeenth Day of February, 2009

JOHN DOLL
*Acting Director of the United States Patent and Trademark Office*